United States Patent
Nabatame et al.

(10) Patent No.: US 6,821,845 B1
(45) Date of Patent: Nov. 23, 2004

(54) SEMICONDUCTOR DEVICE AND METHOD FOR MANUFACTURING THE SAME

(75) Inventors: Toshihide Nabatame, Hitachi (JP); Takaaki Suzuki, Hitachinaka (JP); Tetsuo Fujiwara, Hitachinaka (JP); Kazutoshi Higashiyama, Naka-machi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/806,861

(22) PCT Filed: Oct. 8, 1999

(86) PCT No.: PCT/JP99/05574

§ 371 (c)(1),
(2), (4) Date: Apr. 5, 2001

(87) PCT Pub. No.: WO00/22658

PCT Pub. Date: Apr. 20, 2000

(30) Foreign Application Priority Data

Oct. 14, 1998 (JP) .......................................... 10-291906

(51) Int. Cl.$^7$ .......................................... H01L 21/8242
(52) U.S. Cl. ...................................... 438/253; 438/396
(58) Field of Search .......................... 438/3, 239–240, 438/253–254, 396–397

(56) References Cited

U.S. PATENT DOCUMENTS

| | | | | |
|---|---|---|---|---|
| 5,130,172 A | * | 7/1992 | Hicks et al. | 427/252 |
| 5,973,351 A | * | 10/1999 | Kotecki et al. | 257/310 |
| 6,001,660 A | * | 12/1999 | Park et al. | 438/3 |
| 6,162,712 A | * | 12/2000 | Baum et al. | 438/580 |
| 6,207,232 B1 | * | 3/2001 | Kadokura | 427/252 |
| 6,358,810 B1 | * | 3/2002 | Dornfest et al. | 438/396 |
| 6,483,143 B2 | * | 11/2002 | Matsui et al. | 257/311 |
| 6,503,791 B2 | * | 1/2003 | Matsui et al. | 438/239 |
| 6,512,297 B2 | * | 1/2003 | Matsuno et al. | 257/768 |

FOREIGN PATENT DOCUMENTS

| | | |
|---|---|---|
| JP | 10163131 | 6/1998 |
| JP | 10195656 | 7/1998 |

* cited by examiner

*Primary Examiner*—John F. Niebling
*Assistant Examiner*—Jennifer M. Kennedy
(74) *Attorney, Agent, or Firm*—Antonelli, Terry, Stout & Kraus, LLP

(57) ABSTRACT

A semiconductor device containing a dielectric capacitor having an excellent step coverage for a device structure of high aspect ratio corresponding to high integration degree, as well as a manufacturing method therefor are provided. A dielectric capacitor of high integration degree is manufactured by forming a bottom electrode 46 and a top-electrode 48 comprising a homogeneous thin Ru film with 100% step coverage while putting a dielectric 47 therebetween on substrates 44, 45 having a three-dimensional structure with an aspect ratio of 3 or more by a MOCVD process using a cyclopentadienyl complex within a temperature range from 180° C. or higher to 250° C. or lower.

8 Claims, 5 Drawing Sheets

R=H, CH3, C2H5, C3H7 AND C4H9

R' = C(CH3)3, CH3, CF3

R=H, CH3, C2H5, C3H7 AND C4H9

SEMICONDUCTOR DEVICE AND METHOD FOR MANUFACTURING THE SAME

TECHNICAL FIELD

This invention relates to a semiconductor device containing a dielectric capacitor and a method of manufacture thereof; and, more particularly, the invention relates to a semiconductor device in which an electrode comprising Ru, $RuO_2$ or a mixed material of Ru and $RuO_2$ is deposited homogeneously on a substrate with a three-dimensional structure, and a method of manufacture thereof.

BACKGROUND OF THE INVENTION

Semiconductor memories include a DRAM (Dynamic Random Access Memory) which is capable of high speed data rewriting. Along with progress in ultra large scale integration technology, the DRAM has entered a large capacity range of 256 M to 1 G bit. Therefore, there has been a demand for integration of circuits; and, more particularly, the size of capacitors for storing information has been made finer. Means for effecting the integration of capacitors can include reduction in the film thickness of dielectrics, selection of materials of high dielectric constant and a three-dimensional structure comprising top and bottom electrodes and a dielectric.

Among these choices, for the dielectric material, it has been known that BST having a single unit cell of perovskite structure (($Ba/Sr)TiO_3$) as the crystal structure has higher dielectric constant (∈) compared with $SiO_2/Si_3N_4$. An example of using high dielectric materials has been reported in Japan Journal of Applied Physics, 1995, 5077p (*Jpn. J. Appl. Phys.*, 34, 5077, 1995). According to this report, since the condition for the aspect ratio (contact hole patterns of 800 nm depth/240 nm diameter) of a three-dimensional structure using BST is about 0.65, top and bottom electrodes and a dielectric are prepared by a sputtering method.

SUMMARY OF THE INVENTION

In the prior art described above, since Pt or Ru of the bottom electrode is prepared by the sputtering method, there is a problem in that the three-dimensional structure shows poor step coverage, and adhesion to the inside wall is small compared with that to the surface and the bottom, so that a highly three-dimensional device structure with an aspect ratio of one or more can not be attained.

This invention has been accomplished to overcome the foregoing problems and has the object of providing a semiconductor device, including a dielectric capacitor having excellent step coverage in a device structure at a high aspect ratio, along with a high integration, as well as a manufacturing method of manufacture thereof.

Heretofore, although there has been a report of preparing an electrode comprising Ru, $RuO_2$ or a mixture of Ru and $RuO_2$ thin films by a sputtering method on a three-dimensional structure with a small aspect ratio, a film forming technique using a metalorganic chemical vapor deposition process (MOCVD) has not been taken into consideration.

The present inventors have found that a homogeneous electrode comprising Ru, $RuO_2$ or a mixture of Ru and $RuO_2$ thin films can be prepared on a substrate having a three-dimensional structure within a temperature range from 180° C. or higher to 250° C. or lower by an MOCVD process using a cyclopentadienyl complex. The principle which makes it possible to prepare a homogeneous film in the temperature range described above will be explained with reference to FIG. 5.

FIG. 5 shows a crystal structure of a ruthenium cyclopentadienyl complex used in accordance with this invention. σ or π bonds are present between a 5 membered ring and ruthenium metal, and a temperature at 180° C. or higher is necessary as the energy of dissociation in view of the bonding energy. Further, the adhesion rate of the complex is constant on a Si substrate within a temperature range from 180° C. or higher and 250° C. or lower, and decomposition—adhesion on the surface proceeds preferentially at a higher temperature.

Accordingly, a film is formed only on the surface (top plane of protruded portions) in a substrate having a three-dimensional structure to form inhomogeneous films with the film thickness reduced on the inside wall and the bottom (top plane of convex portions). Particularly at a temperature higher than 300° C., island crystals are formed due to a rapid decomposing reaction to form a rough film quality for which contact can not be attained. Accordingly, a homogeneous electrode comprising Ru, $RuO_2$ or a mixture of Ru and $RuO_2$ thin films can be formed on the surface, the bottom and the inside wall on a substrate having a three-dimensional structure by the MOCVD process using a ruthenium cyclopentadienyl complex within a temperature range from 180° C. or higher to 250° C. or lower.

Further, the present inventors have found that an electrode comprising Ru, $RuO_2$ or a mixture of Ru and $RuO_2$ thin films can be formed homogeneously by the MOCVD process using a β-diketone complex within a temperature range from 300° C. or higher to 500° C. or lower when a structure having a three-dimensional configuration is constituted of two insulation layers, namely, a surface layer with a small adhesion rate and a inside wall layer with a large adhesion rate. The principle will be explained with reference to FIG. 2.

FIG. 2 shows a crystal structure of a ruthenium β-diketone complex used in accordance with this invention. π bonds are present between oxygen in a 6 membered ring and ruthenium metal and can dissociate at a temperature of 300° C. or higher in view of the bond energy. However, since dissociation of an oxygen—carbon bond or dissociation of an oxygen—ruthenium bond proceeds simultaneously. the adhesion rate is small and decomposition deposition near the surface proceeds preferentially. Further, at a temperature higher than 500° C., island crystals are formed due to violent decomposing reaction to result in a film quality that is not capable of attaining contact. Then, as shown in FIG. 3, a homogeneous electrode thin film comprising Ru, $RuO_2$ or a mixture of Ru and $RuO_2$ can be prepared on the surface, the bottom and the inside wall within a temperature range from 300° C. or higher to 500° C. or lower by an MOCVD process using a ruthenium β-diketone complex on a structure having a three-dimensional configuration by constituting the structure having a three-dimensional configuration with an insulation layer consisting of a dual layered structure comprising a surface layer 31 having a small adhesion rate and a side wall layer 32 having a large adhesion rate, for example, $MgO/SiO_2$ or $Al_2O_3/SiO_2$ for the electrode material.

This invention has been accomplished based on the studies as described above, and it features a method of manufacturing a semiconductor device by laminating to form a bottom electrode, a dielectric and a top electrode on a substrate having a three-dimensional structure, wherein a bottom electrode and a top electrode are formed by a metalorganic chemical vapor deposition method at a temperature of 180° C. or higher and 250° C. or lower using a cyclopentadienyl complex as a precursor.

The cyclopentadienyl complex is used as an Ru precursor and, more particularly, dicyclopentadienyl ruthenium is preferred. The bottom electrode and the top electrode are formed each as a thin film comprising Ru, $RuO_2$ or mixture of Ru and $RuO_2$.

By using one Of $O_2$, $H_2$, $N_2O$, $O_3$, CO and $CO_2$ as a reaction gas, a decomposing reaction from the precursor can be promoted to form a film at a low temperature of 180° C. or higher to 250° C. or lower. Particularly, in a gas mixture of a reaction gas and a carrier gas (Ar, He or $N_2$ gas), the ratio of the reaction gas to the carrier gas is preferably 1% or more.

According to this feature, an electrode thin film can be prepared homogeneously on the surface, the bottom and the side wall on the substrate having a three-dimensional structure. Accordingly, it is possible to obtain a dielectric capacitor of high integration degree comprising a top electrode/a dielectric/a bottom electrode having a three-dimensional structure of high aspect ratio of 3 or more (contact hole depth/diameter).

Further, this invention has a feature in a method of manufacturing a semiconductor device of laminating to form a bottom electrode, a dielectric and a top electrode on a substrate having a three-dimensional structure, wherein the structure having a three-dimensional constituted of an insulation film of a two-layered structure comprising a surface layer with a small adhesion rate and a side wall layer with a large adhesion rate for the starting electrode material and the bottom electrode and the top electrode are formed by metalorganic chemical vapor deposition process using a β-diketone complex as the precursor at a temperature of 300° C. or higher and 500° C. or lower.

The β-diketone complex is used as the precursor for Ru and dibivaloylmethanate ruthenium is particularly preferred. The bottom electrode and the top electrode are formed each as a thin film comprising Ru, $RuO_2$, or a mixture of Ru and $RuO_2$. A decomposing reaction is promoted at a temperature of 300° C. or higher to 500° C. or less to prepare a homogeneous electrode thin film by using one of $O_2$, $H_2$, $N_2O$, $O_3$, CO and $CO_2$ as the reaction gas while using one of Ar, He and $N_2$ as the carrier gas. In the gas mixture of the reaction gas to the carrier gas, the ratio of the reaction gas and the carrier gas may be 0% or more. That is, the reaction gas may or may not be used.

According to this feature, since the three-dimensional structure is constituted of two insulation layers comprising a surface layer of small adhesion rate and a side wall layer of large adhesion rate, and the electrode thin film can also be formed on the side wall to which it is less vapor deposited, an electrode thin film of uniform film thickness comprising Ru, $RuO_2$ or a mixture of Ru and $RuO_2$ can be prepared. Accordingly, a semiconductor device can be provided which includes a dielectric capacitor with a device structure having a high aspect ratio of 3 or more, corresponding to a high integration degree and having a step coverage performance. Particularly, when the structure comprising two insulation layers is $MgO/SiO_2$ or $Al_2O_3/SiO_2$, a uniform electrode thin film can be prepared depending on the different adhesion rate of the precursor.

Further, this invention features a semiconductor device having a dielectric and electrodes for applying a voltage to the dielectric in which the electrode is a thin film electrode comprising Ru, $RuO_2$ or a mixture of Ru and $RuO_2$ formed on a structure with an aspect ratio of the three-dimensional structure (contact hole depth/diameter) of 3 or more.

The semiconductor device can contain an electrode thin film of a uniform thickness comprising a Ru, $RuO_2$ or a mixture of Ru and $RuO_2$ manufactured by an MOCVD process from a cyclopentadienyl complex, or an electrode thin film of a uniform thickness comprising Ru, $RuO_2$ or a mixture of Ru and $RuO_2$ manufactured by an MOCVD process from the β-diketone complex of high integration degree having a top electrode/dielectric/bottom electrode. Since the electrode thin film is formed homogeneously on the surface, the bottom and the side wall on the substrate having a three-dimensional structure, it is possible to obtain a dielectric capacitor of high integration degree, which is capable of functioning intactly having a three-dimensional structure of high aspect ratio. When such a dielectric capacitor is used for semiconductor devices, such as a DRAM, the capacity can be increased.

Further, this invention has a feature of forming the bottom electrode and the top electrode by a metalorganic chemical vapor deposition process of liquid carrying and evaporation using a starting solution in which a precursor containing a cyclopentadienyl complex is dissolved in tetrahydrofurane, toluene, hexane or octane. According to this feature, since the precursor can be supplied stably for a long period of time, a bottom electrode and a top electrode with good film quality can be formed and a semiconductor device with high performance can be manufactured. The method of manufacture of for the semiconductor device according to this invention is excellent for use in mass production of semiconductor devices. In the manufacturing method according to this invention, a bottom electrode, and a top electrode, which are homogeneous and of high quality, can be formed at a temperature of 180° C. or higher and 250° C. or lower.

Further, this invention has a feature of forming the bottom electrode and the top electrode by a metalorganic chemical vapor deposition process of liquid carrying and evaporation using a starting solution in which a precursor containing a β-diketone complex is dissolved in tetrahydrofurane, toluene, hexane or octane. According to this feature, since the precursor can be supplied stably for a long period of time, a bottom electrode and a top electrode with good film quality can be formed and a semiconductor device with high performance can be manufactured. The manufacturing method for producing the semiconductor device according to this invention is excellent for use in mass production of semiconductor devices. In the manufacturing method according to this invention, a bottom electrode and a top electrode which are homogeneous and of high quality can be formed at a temperature of 300° C. or higher and 500° C. or lower.

When the liquid carrying and evaporation metalorganic chemical vapor deposition process using a starting solution in which a precursor containing the cyclopentadienyl complex or the β-diketone complex is dissolved in a tetrahydrofuran solvent is used, since the starting solution can be stored at room temperature, thermal denaturation of the precursor as typically caused when using the sublimation method can be suppressed, and, as a result, the precursor can be supplied stably for a long period of time. The liquid carrying and evaporation metalorganic chemical vapor deposition process is a method consisting of dissolving a precursor into a solvent to prepare a starting solution, heating the starting solution in an evaporator to obtain an evaporated precursor and conducting the chemical vapor deposition process.

Further, this invention has a feature of using a solvent having a solubility of 0.05 mol/l or more for the precursor, such as tetrahydrofuran, toluene, hexane or octane. According to this feature, since evaporation of the precursor and the solvent takes place simultaneously in the evaporation step of the liquid carrying and evaporation metalorganic chemical vapor deposition process, the precursor can be supplied stably for a long period of time, which makes it possible to manufacture a semiconductor device with a higher performance.

In a case of a solvent with a solubility of 0.05 mol/l or lower, only the solvent of lower boiling point is evaporated selectively in an evaporator and, as a result, the precursor of high boiling point is deposited in the inside of the evaporator to cause clogging, making it difficult to stably supply. The solubility of the diethylcyclopentadienyl ruthenium (Ru(EtCp)$_2$) complex as the cyclopentadienyl complex to each kind of solvent is 1.74 mol/l for tetrahydrofuran, 1.4 mol/l for toluene, 1.4 mol/l for hexane and 1.4 mol/l for octane, and the precursor can be supplied stably in the liquid carrying and evaporation metalorganic chemical vapor deposition process. Further, the solubility of the dibivaloyl-methanate ruthenium (Ru(dpm)$_3$) complex as the β-diketone complex to each kind of the solvent is 0.52 mol/l for tetrahydrofuran, 0.45 mol/l for toluene, 0.27 mol/l for hexane and 0.25 mol/l for octane, and the starting material can be supplied stably in the liquid carrying and evaporation metalorganic chemical vapor deposition process.

Further, in accordance with this invention, since the organic ingredient of the precursor and the reaction gas are subjected to combustion or reductive reaction in the course of forming the film when $O_2$, $H_2$, CO or $CO_2$ is used as the reaction gas, the residual carbon content in the electrode film for the bottom electrode and the top electrode can be defined as $10^{-2}$ at % or more and 1 at % of less, by which a high quality bottom electrode and top electrode not causing contact failure can be formed, and a semiconductor device with high performance can be manufactured.

Further, this invention features a method of forming a thin film on the surface and the lateral side of a structure having a three-dimensional shape in which the structure comprises the lamination of a two layered structure consisting of a surface layer with a small adhesion rate and a side wall layer with a large adhesion rate for the starting thin film material. Use of the 2-layered structure described with reference to FIG. 3 is not restricted only to the case of forming the Ru thin film as the electrode by the MOCVD process and is generally applicable also in a film forming method, such as a sputtering method, a vacuum vapor deposition method or an MBE method as a method for forming a homogeneous film on the surface, the side wall and the bottom in a case where the film tends to be deposited preferentially only on the surface.

BEST MODE FOR CARRYING OUT THE INVENTION

A method of manufacturing a semiconductor device according to this invention will be explained specifically with reference to the drawings.

EXAMPLE 1

Figure 5:
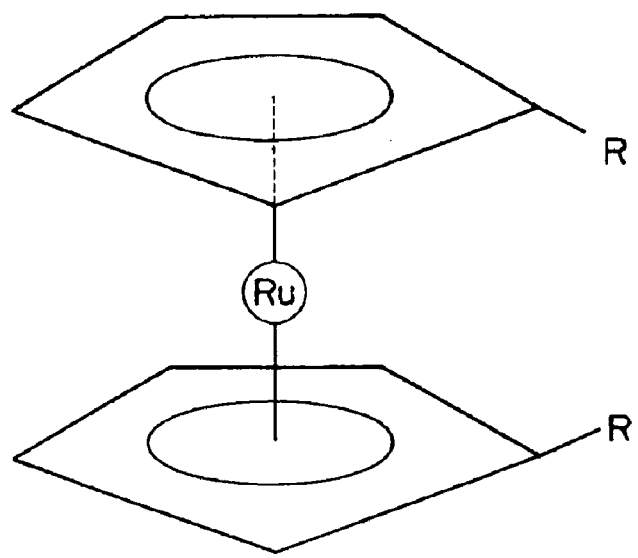
FIG. 5 is a diagram of a crystal structure of a cyclopentadienyl complex.

A method of manufacturing a semiconductor device using a crystal structure shown in FIG. 5 of a discyclopentadienyl ruthenium (RuCP$_2$) complex in which R=H will be described.

Figure 4:
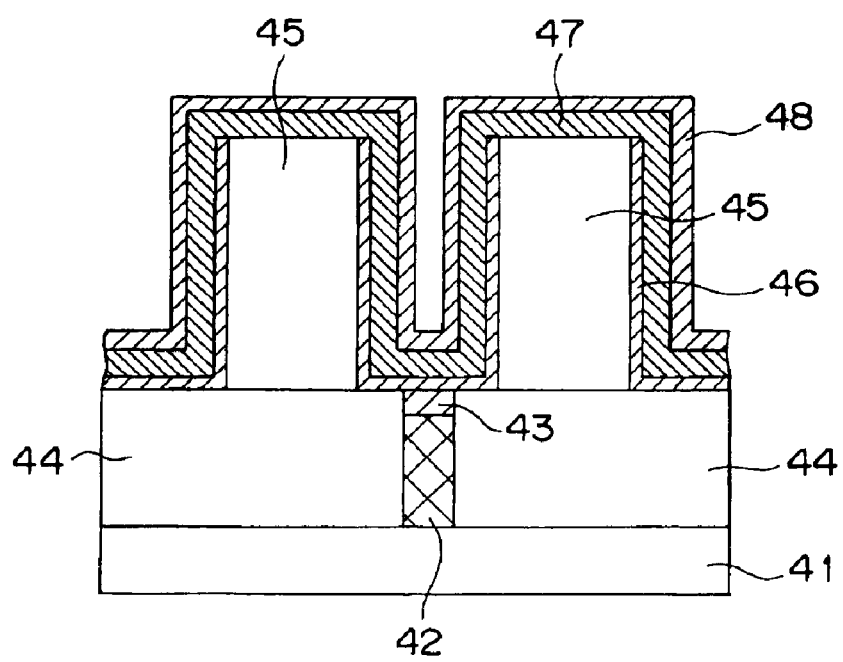
FIG. 4 is a cross sectional view of an example of a dielectric capacitor contained in a semiconductor device manufactured according to this invention.

FIG. 4 is a cross sectional view of a dielectric capacitor contained in a semiconductor device manufactured in accordance with this example. At first, an Si wafer 41 was heated to 300° C. and a contact hole is opened in an SiO$_2$ layer 44 formed by thermal oxidation and then an Si plug 42 is prepared. Then, a barrier layer 43 made of a TiN layer of 100 Å thickness was prepared on the Si plug 42 by a sputtering method. Further, after forming an SiO$_2$ layer 45 of 8000 Å thickness by a plasma CVD process using starting TEOS material, a 2400 Å diameter was fabricated around the contact hole as a center to prepare a substrate having a three-dimensional shape. The aspect ratio (contact hole depth/diameter) of the three-dimensional structure is 3.33.

A bottom electrode 46 was prepared on the substrate. For the preparation of the bottom electrode 46, an RuCP$_2$ complex was formulated at a concentration of 0.05 to 0.25 mol/l into a THF (tetrahydrofuran) solvent to form a CVD precursor. The CVD precursor was supplied at a rate of 0.1 to 3 sccm by using a liquid mass flow controller. After converting the CVD precursor all at once from liquid to gas by setting the temperature of a vaporizer to 80 to 150° C., it was carried on an Ar gas at 198 to 500 sccm. Then, after mixing the CVD/Ar gas with oxygen gas at 2 to 800 sccm, they were introduced into a reactor. The pressure in the reactor was set to 0.01 to 50 torr, the film forming temperature was set to 180° C. or higher and 250° C. or lower to form film for 1 to 20 min to obtain a film thickness of 20 to 30 nm.

As a result of measurement by X-ray diffractiometry for the obtained film, it was found to be an Ru film at 1 to 25%, an Ru/RuO$_2$ mixed film at 25 to 50% and an RuO$_2$ film at 50 to 400%. Further, the film is in the form of RuO$_2$ even if the O$_2$/Ar ratio is 400% or more. By the way, in a case where O$_2$/Ar=6%, granular crystals were formed to provide an inhomogeneous film quality.

Figure 1:
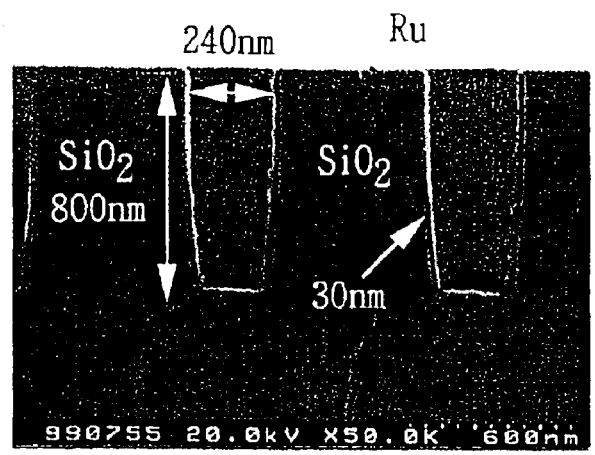
FIG. 1 shows cross sectional SEM images of an Ru film obtained at $O_2$/Ar ratio of 5% in accordance with this invention.

FIG. 1 shows cross sectional SEM images of the Ru film obtained at the O$_2$/Ar ratio of 5%. It was found that the Ru film was formed homogeneously on the surface, the bottom and the side wall, and the film has a step coverage (film side wall/film surface) of 100%. Further, the surface roughness of the film was ±10 Å or less and the film quality was extremely smooth. As a result of measurement for a specific resistivity, the resistance was as low as p=50 μΩ/cm$^2$ at room temperature.

Further, when the residual amount of carbon was analyzed along the direction of the depth in the film by secondary ion mass spectroscopy, the carbon content was within a range from $10^{-2}$ at % or more to 1 at % or less, and it was a thin film with high quality.

Then, (Ba, Sr)TiO$_3$(BST) was prepared as a dielectric 47 on the bottom electrode 46 by an MOCVD process. Barium dibivaloylmethanate Ba(dpm)$_2$, Sr(dpm)$_2$ and Ti(O-i-Pr)$_2$ (dpm)$_2$ were used for the precursors and each of the materials was prepared at a concentration of 0.05 to 0.25 mol/l into a THF solvent to form a CVD precursor. Each of the CVD precursor was supplied at a rate of 0.1 to 3 sccm from a liquid mass flow controller to an evaporator set to 250° C. The CVD precursor gas was introduced by the Ar carrier gas at 200 sccm into the reactor and 5 to 100 sccm of an oxygen gas was also introduced to the reactor. Film adhesion was conducted for 3 min by setting the pressure of the reactor to 0.01 to 50 torr and a film forming temperature to 420° C., to form a BST thin film to 30 run.

Then, the film was heat treated at 700° C. for 30 to 60 sec in an N$_2$ or Ar gas to improve the crystallinity. A top electrode 48 was formed on the dielectric 47. The film was formed by the same method and under the same conditions as those for forming the bottom electrode 46, to obtain a homogeneous thin Ru film with 100% step coverage on the three-dimensional structure with an aspect ratio of 6.17. The thus obtained dielectric capacitor showed excellent electrical characteristics with the specific dielectric constant $\in$ of 300 at 1V.

In addition to the discyclopentadienyl ruthenium complex in which R=H, homogeneous thin Ru films could be formed as the bottom electrode and the top electrode by the same method as described above also in a case of using bis (methylcyclopentadienyl) ruthenium at R=CH$_3$, bis (ethylcyclopentadienyl) ruthenium at R=C$_2$H$_5$, bis (propylcyclopentadienyl) ruthenium at R=C$_3$H$_7$, bis (butylcyclopentadienyl) ruthenium at R=C$_4$H$_9$.

Further, while O$_2$ was used as the reaction gas, as described above, a homogeneous thin Ru film could be formed also by using one of H$_2$, N$_2$O, O$_3$, CO and CO$_2$. Further, while the Ar gas has been explained as the carrier gas, an He or N$_2$ gas may also be used, and it has been found that any combination of them can form an Ru film at 1 to 25%, an Ru/RuO$_2$ mixed film at 25 to 50% and an RuO$_2$ film at 50 to 400% or more as the reaction gas to the carrier gas ratio.

EXAMPLE 2

Figure 2:
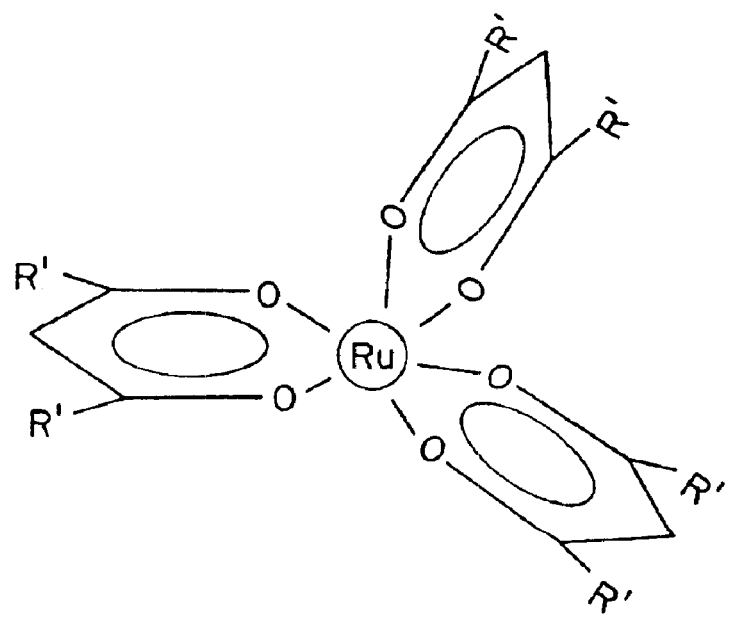
FIG. 2 is a diagram of a crystal structural view of a β-diketone complex.
Figure 3:
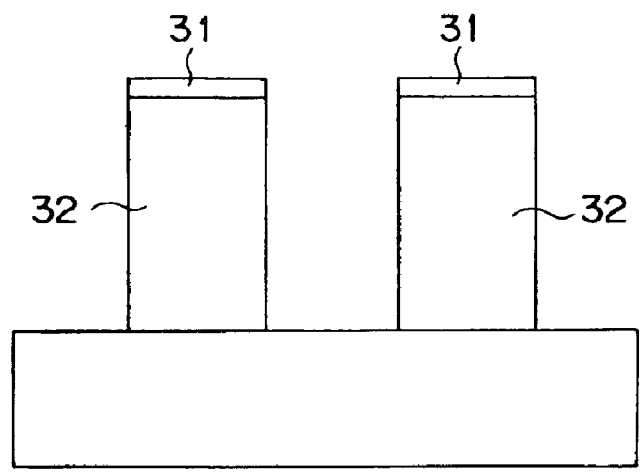
FIG. 3 is a cross sectional view illustrating a structure comprising a two layered insulation layer.

A method of manufacturing a semiconductor device using a crystal structure of the β-diketone complex shown in FIG. 2 of a dibivaloylmethanate ruthenium (Ru(dpm)$_3$) complex in which R'=C(CH$_3$)$_3$ will be described below.

Figure 6:
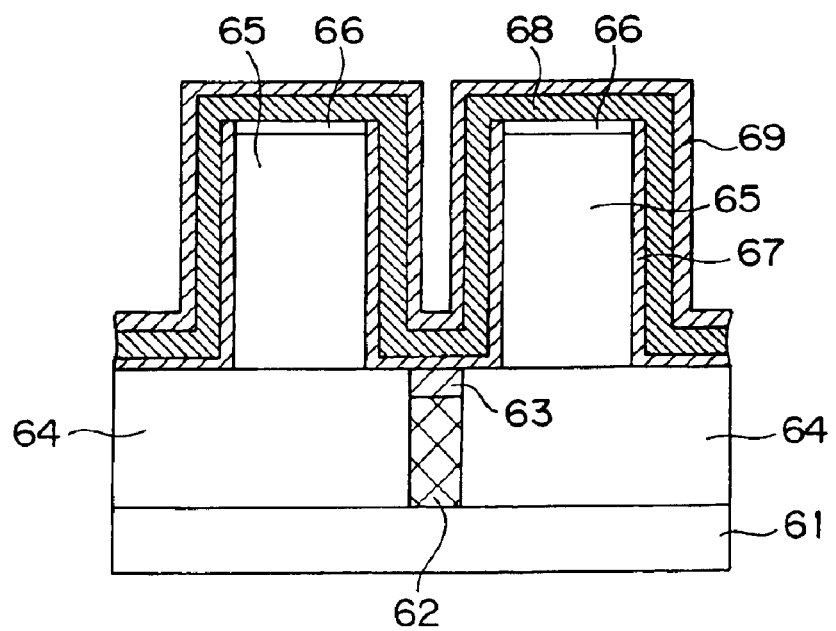
FIG. 6 is a cross sectional view of another example of a dielectric capacitor contained in a semiconductor device manufactured according to this invention.

FIG. 6 is a cross sectional view of a dielectric capacitor contained in a semiconductor device manufactured in accordance with this example. In the same manner as in Example 1, after opening a contact hole to an SiO$_2$ layer 64 formed by thermally oxidizing an Si wafer 61, preparing an Si plug 62 and then forming a TiN barrier layer 63, an insulation layer 65 of an SiO$_2$ layer was prepared to a thickness of 7800 Å by a plasma CVD process. Then, an MgO layer was deposited as an insulation layer 66 by a sputtering process using Mg as a target. A film of 200 Å thickness was obtained by using a 1:1 gas mixture of oxygen and argon as a sputtering gas at a film forming pressure of 2 Pa and with RF power of 200 W. A 2400 Å diameter was fabricated around a contact hole as a center to prepare a substrate having a three-dimensional structure. The aspect ratio of the three-dimensional structure is 3.33.

A bottom electrode 67 was prepared on the substrate. For the preparation of the bottom electrode 67, dibivaloylmethanate ruthenium (Ru(dpm)$_3$) of the crystal structure of the β-diketone complex at R'=C(CH$_3$)$_3$ shown in FIG. 2 was formulated at a concentration of 0.05 to 0.25 mol/l in a THF solvent to form a CVD precursor. The CVD precursor was supplied at a rate of 0.1 to 3 sccm by using a liquid mass flow controller. After converting the CVD precursor all at once from liquid to gas by setting the temperature for the evaporator to 100 to 200° C., it was carried on an Ar gas at 198 to 500 sccm. Then. after mixing the CVD/Ar gas and an oxygen gas at 0 to 800 sccm, they were introduced into a reactor. A film of 20 to 30 nm thickness was obtained by depositing a film at a pressure of the reactor of 0.01 to 50 torr, at a film forming temperature of 300° C. or higher to 500° C. or lower for 1 to 20 min.

As a result of measurement by X-ray diffractiometry for the obtained film, it has been found that the film is an Ru film at 0 to 25% or less, an Ru/RuO$_2$ mixed film at 25 to 50% or less and an RuO$_2$ film at 50 to 400% or more as O$_2$/Ar ratio. From the result of SEM observation for the cross section of the Ru film of 20 run thickness obtained at the O$_2$/Ar ratio of 0%, it has been found that the Ru film was formed homogeneously on the surface, the bottom and the side wall, and the step coverage of the film (film side wall/film surface) was about 100%. Further, the surface roughness of the film was ±8 Å or less, showing an extremely smooth film quality. As a result of measurement for the specific resistivity, the resistance was as low as p=50 $\mu\Omega$/cm$^2$ at room temperature.

Then, BST was prepared to a film thickness of 30 nm as a dielectric 68 on the bottom electrode 67 by an MOCVD process in the same manner as in Example 1. Then, a heat treatment was applied in an N2 or Ar gas at 700° C. for 30 to 60 sec, to improve the crystallinity. A top electrode 69 was formed on the dielectric 68. The top electrode 69 was formed by forming a film by the same method and under the same conditions as those in the formation of the bottom electrode 67 and a homogeneous thin Ru film with 100% step coverage could be formed on the aspect ratio of 6.17. The thus obtained dielectric capacitor showed excellent electrical characteristics with the specific dielectric constant e of 300 at 1 V.

An identical homogeneous thin Ru film could also be prepared by using an Al$_2$0$_3$ layer manufactured by a sputtering process using Al as a target, instead of MgO as an insulation layer 66.

Homogeneous Ru thin films could be formed on the bottom electrode and the top electrode by the same method as described above also in a case of using acetylacetonate ruthenium at R'=CH$_3$ and hexafluoroacetyl acetonate ruthenium at R'=CF$_3$ in addition to the dibivaloylmethanate ruthenium complex at R'=C(CH$_3$)$_3$.

Further, while 0$_2$ was used as the reaction gas, a homogeneous Ru thin film could be formed also by using one of H$_2$, N$_2$0, 0$_3$, CO and CO$_2$. Further, while a description has been made of the use of Ar gas as the carrier gas, He or N$_2$ gas may also be used, and it has been found that any combination of them could form an Ru film at a ratio of 0 to 25%, an Ru/RuO$_2$ mixed film at 25 to 50% and an RuO$_2$ film at 50 to 400% or more as the reaction gas to the carrier gas ratio.

EXAMPLE 3

A third example of this invention will be explained with reference to FIG. 7.

Figure 7:
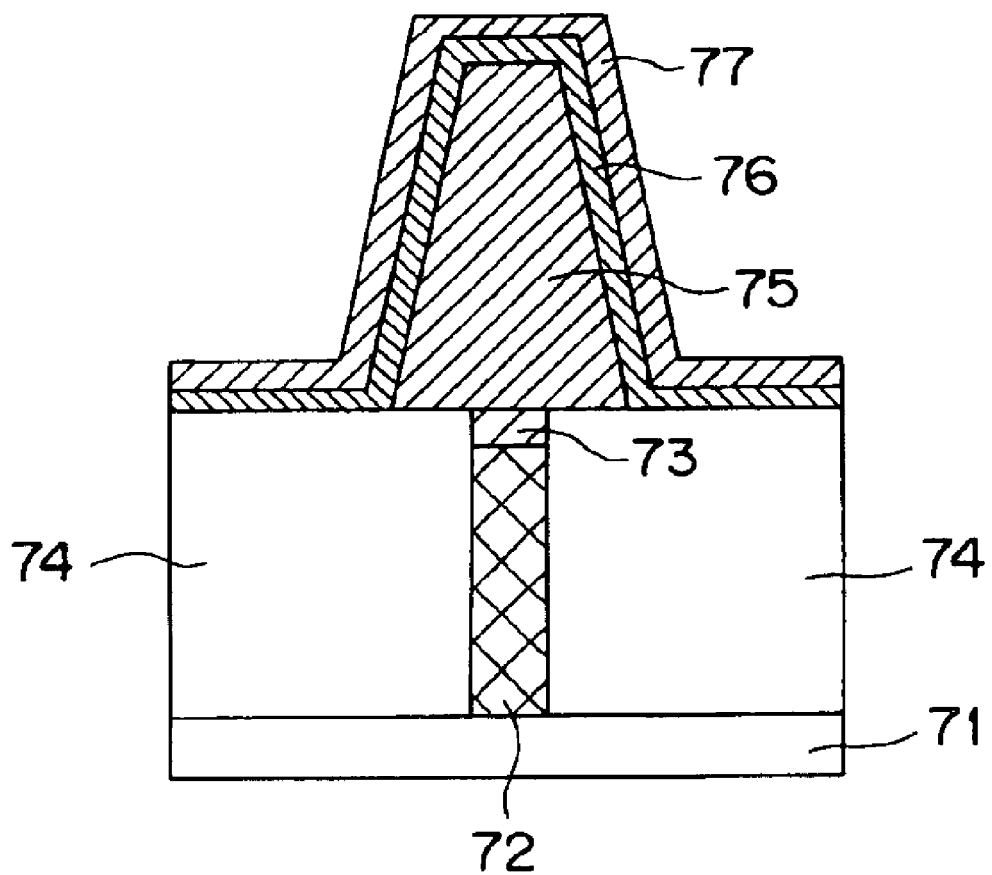
FIG. 7 is a cross sectional view of a further example of a dielectric capacitor contained in a semiconductor device manufactured according to this invention.

FIG. 7 is a cross sectional view of a dielectric capacitor contained in a semiconductor device manufactured in accordance with this example. In the same manner as in Example 1, after opening a contact hole to an SiO$_2$ layer 74 formed by thermally oxidizing an Si wafer 71, preparing an Si plug 72 and then forming a TiN barrier layer 73, an Ru layer was formed by a sputtering process using Ru as a target. A film of 5000 Å thickness was obtained by using an Ar gas as a sputtering gas, at a film forming pressure of 2 Pa and with an RF power of 1200 W. Then, a top electrode 75 having a three-dimensional structure was formed by fabricating a trapezoidal shape around the contact hole as a center. The aspect ratio of the three-dimensional structure is 3.0.

Then, BST as a dielectric 76 was formed to a 30 nm film thickness on the bottom electrode 75 by an MOCVD process in the same method as in Example 1. Then, heat treatment was applied in an $N_2$ or Ar gas at 700° C. for 30 to 60 sec to improve the crystallinity. A top electrode 77 was formed on the dielectric 76. The top electrode 77 was formed by preparing a thin film of Ru, $RuO_2$ or a mixture of Ru and $RuO_2$ at a thickness of 20 nm under the same conditions as those in Example 1 by a CVD process using a $RuCp_2$/THF precursor. The resultant dielectric capacitor showed excellent electrical characteristics with a specific dielectric constant ∈ of 280 at 1 V.

EXAMPLE 4

Figure 8:
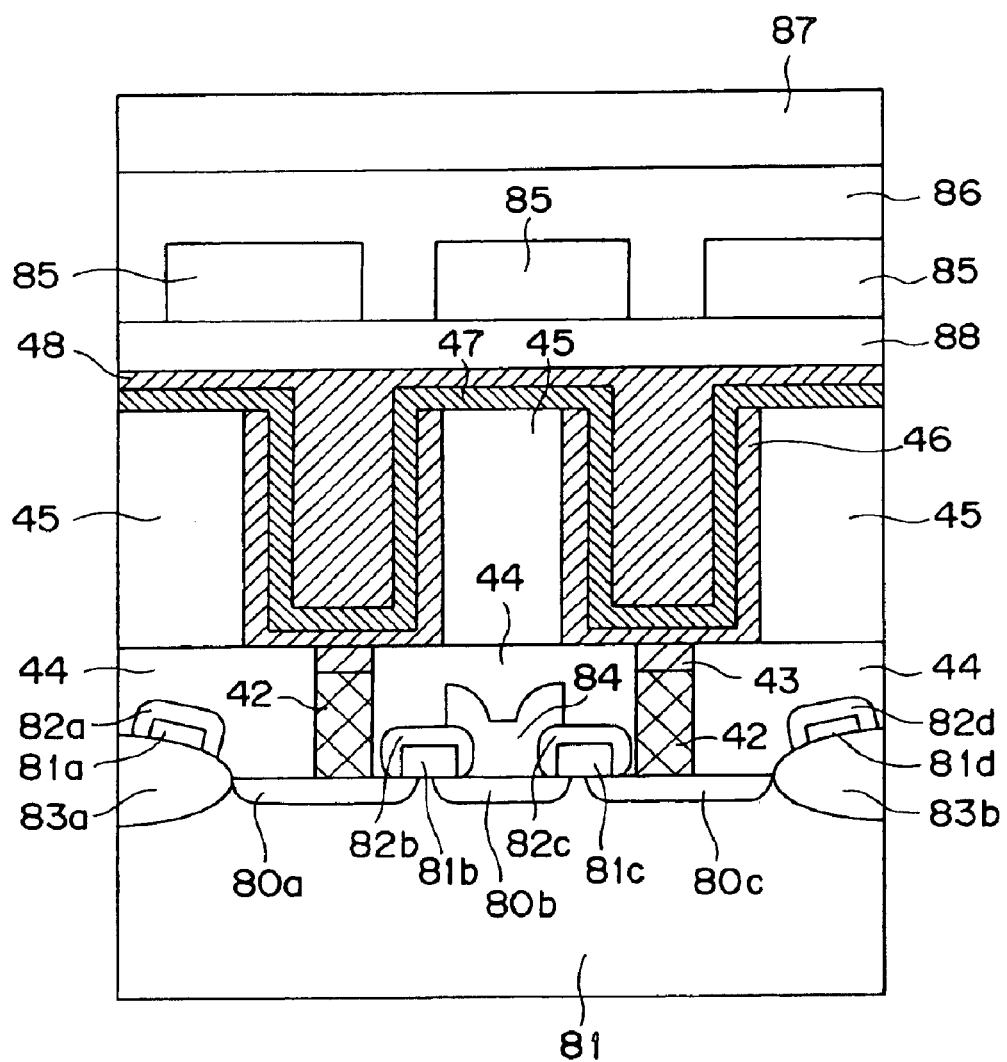
FIG. 8 is a cross sectional view of a DRAM cell manufactured according to this invention.

A fourth example of this invention will be explained with reference to FIG. 8. FIG. 8 is a cross sectional view of a DRAM as a semiconductor device using the dielectric capacitor prepared in Example 1. Device isolation oxide films 83a, 83b were prepared by an oxidizing method on a P-type semiconductor substrate 81, and N-type source/drain regions 80a, 80b, 80c were prepared on the main surface of the semiconductor substrate by ion implantation. Gate electrodes 81a, 82b, 82c and 82d each of 200 nm film thickness were formed by way of a gate oxide film of 12 nm thickness on a channel region. A buried bit line 84 connected electrically was formed on the source/drain region 80b by photolithography and dry etching, and an $SiO_2$ layer 14 was formed so as to cover the entire surface. Subsequently, a dielectric capacitor comprising a top electrode, a dielectric and a bottom electrode was prepared by the method shown in Example 1. Then, after forming an interlayer insulation film 88 so as to cover the top electrode 19, the film was flattened by a chemical etching method. First layer aluminum wirings were formed at a space thereon, an insulation protective film 86 was prepared so as to cover the wirings and a second layer aluminum wiring layers 87 were formed thereon. In the same manner as described above, a DRAM can be prepared also by using the dielectric capacitor prepared in Example 2.

While the THF solvent was used in the MOCVD process for forming the top electrode and the bottom electrode in Examples 1 to 4, there is no particular restriction for the solvent so long as it is a material capable of dissolving the precursor, and toluene or ether may be used, for example, with no trouble.

Furthermore, the method of forming the top electrode and the bottom electrode as explained in Examples 1 to 4 is the MOCVD process starting from a starting precursor, but similar effects could also be obtained by a material gas supply method by a sublimation method from a solid precursor or a starting gas supply method by a bubbling method from a liquid precursor. Particularly, since the precursor can be supplied stably for a long period of time by forming the bottom electrode and the top electrode by a liquid carrying and evaporation metalorganic chemical vapor deposition method, the bottom electrode and the top electrode with good film quality can be formed so as to produce a semiconductor device with high performance.

According to this invention, a semiconductor device containing a dielectric capacitor having an excellent step coverage for a device structure having a high aspect ratio corresponding to a high degree of integration can be obtained.

What is claimed is:

1. A method of manufacturing a semiconductor device having a dielectric capacitor including a bottom electrode, a dielectric layer and a top electrode on an underlying substrate having a three-dimensional structure, comprising:

providing a substrate having an insulation layer provided thereon, the insulation layer having a hole formed therein;

forming a bottom electrode on at least a side wall of the insulation layer in the hole;

providing a dielectric layer on the bottom electrode; and forming a top electrode on the dielectric layer;

wherein the bottom electrode and the top electrode are formed by a metalorganic chemical vapor deposition process at 180° C. or higher and 250° C. or lower using a cyclopentadienyl ruthenium complex as a precursor and a reaction gas selected from the group consisting of $O_2$, $H_2$, $N_2O$, $O_3$, CO and $CO_2$, where a volume ratio of the reaction gas to a carrier gas is 1% or more.

2. A method of manufacturing a semiconductor device as defined in claim 1, wherein one of $O_2$, $N_2O$, $O_3$, CO and $CO_2$ is used as a reaction gas and the volume ratio of the reaction gas to a carrier gas is 1% or more.

3. A method of manufacturing a semiconductor device as defined in claim 1, wherein each of the top electrode and the bottom electrode comprises Ru, $RuO_2$ or a mixture of Ru and $RuO_2$.

4. A method of manufacturing a semiconductor device as defined in claim 1, wherein the cyclopentadienyl ruthenium complex is dissolved in an organic solvent having a solubility for the starting precursor of 0.05 mol/l or more, by a liquid carrying and evaporation, metalorganic chemical vapor deposition process.

5. A method of manufacturing a semiconductor device as defined in claim 4, wherein the organic solvent is selected from the group consisting of tetrahydrofuran, toluene, hexane and octane.

6. A method of manufacturing a semiconductor device as defined in claim 1, wherein said dielectric layer is formed by a metalorganic chemical vapor deposition process.

7. A method of manufacturing a semiconductor device as defined in claim 1, wherein the bottom electrode is formed homogenously on the side wall of the insulation layer in the hole and on the bottom of the hole.

8. A method of manufacturing a semiconductor device as defined in claim 7, wherein the hole has an aspect ratio of depth/diameter of 3 or more.

* * * * *